(12) United States Patent
McMullan et al.

(10) Patent No.: US 10,461,075 B2
(45) Date of Patent: *Oct. 29, 2019

(54) EMBEDDED TUNGSTEN RESISTOR

(71) Applicant: TEXAS INSTRUMENTS INCORPORATED, Dallas, TX (US)

(72) Inventors: Russell Carlton McMullan, Allen, TX (US); Binu Kamblath Pushkarakshan, Bangalore (IN); Subramanian J. Narayan, Vijayanagar Bangalore (IN); Swaminathan Sankaran, Plano, TX (US); Keith Edmund Kunz, Bryan, TX (US)

(73) Assignee: Texas Instruments Incorporated, Dallas, TX (US)

( * ) Notice: Subject to any disclaimer, the term of this patent is extended or adjusted under 35 U.S.C. 154(b) by 120 days.

This patent is subject to a terminal disclaimer.

(21) Appl. No.: 14/864,538

(22) Filed: Sep. 24, 2015

(65) Prior Publication Data

US 2016/0071839 A1 Mar. 10, 2016

Related U.S. Application Data

(63) Continuation of application No. 13/586,672, filed on Aug. 15, 2012, now Pat. No. 9,184,226.

(Continued)

(51) Int. Cl.
*H01L 23/522* (2006.01)
*H01L 27/06* (2006.01)
(Continued)

(52) U.S. Cl.
CPC ...... *H01L 27/0676* (2013.01); *H01L 27/0629* (2013.01); *H01L 27/0802* (2013.01);
(Continued)

(58) Field of Classification Search
CPC .. H01L 28/24; H01L 27/0629; H01L 27/0802
See application file for complete search history.

(56) References Cited

U.S. PATENT DOCUMENTS 9,184,226 B2 * 11/2015 McMullan ............... H01L 28/24
2003/0006415 A1 * 1/2003 Yokogawa .......... H01L 21/8213
257/77

(Continued)

*Primary Examiner* — Thomas L Dickey
(74) *Attorney, Agent, or Firm* — Rose Alyssa Keagy; Charles A. Brill; Frank D. Cimino

(57) ABSTRACT

A high TCR tungsten resistor on a reverse biased Schottky diode. A high TCR tungsten resistor on an unsilicided polysilicon platform geometry. A high TCR tungsten resistor between two parallel polysilicon leads on remaining contact etch stop dielectric. A high TCR tungsten resistor embedded in a intermetal dielectric layer above a lower interconnect layer and below an upper interconnect layer. A method of forming a high TCR tungsten resistor on a reverse biased Schottky diode. A method of forming high TCR tungsten resistor on an unsilicided polysilicon platform geometry. A method of forming high TCR tungsten resistor between two parallel polysilicon leads on remaining contact etch stop dielectric. A method of forming high TCR tungsten resistor embedded in a inter metal dielectric layer above a lower interconnect layer and below an upper interconnect layer.

22 Claims, 13 Drawing Sheets

Related U.S. Application Data

(60) Provisional application No. 61/523,575, filed on Aug. 15, 2011.

(51) Int. Cl.
*H01L 49/02* (2006.01)
*H01L 27/08* (2006.01)
*H01L 29/66* (2006.01)
*H01L 29/872* (2006.01)

(52) U.S. Cl.
CPC ........ *H01L 28/24* (2013.01); *H01L 29/66143* (2013.01); *H01L 29/8725* (2013.01)

(56) References Cited

U.S. PATENT DOCUMENTS

| | | | | |
|---|---|---|---|---|
| 2005/0020021 A1* | 1/2005 | Fujiwara | ............ | H01L 21/3185 438/303 |
| 2005/0121746 A1* | 6/2005 | Erickson | ............ | H01L 27/0802 257/536 |
| 2006/0118908 A1* | 6/2006 | Erickson | ................ | H01L 28/20 257/536 |
| 2007/0284662 A1* | 12/2007 | Chinthakindi | ...... | H01L 27/0629 257/350 |
| 2008/0284662 A1 | 11/2008 | Yagi | | |
| 2009/0065888 A1* | 3/2009 | Kato | .................. | H01L 27/0629 257/476 |
| 2010/0032770 A1* | 2/2010 | Park | .................... | H01L 23/367 257/379 |
| 2012/0256292 A1* | 10/2012 | Yu | ...................... | H01L 27/0255 257/510 |

\* cited by examiner

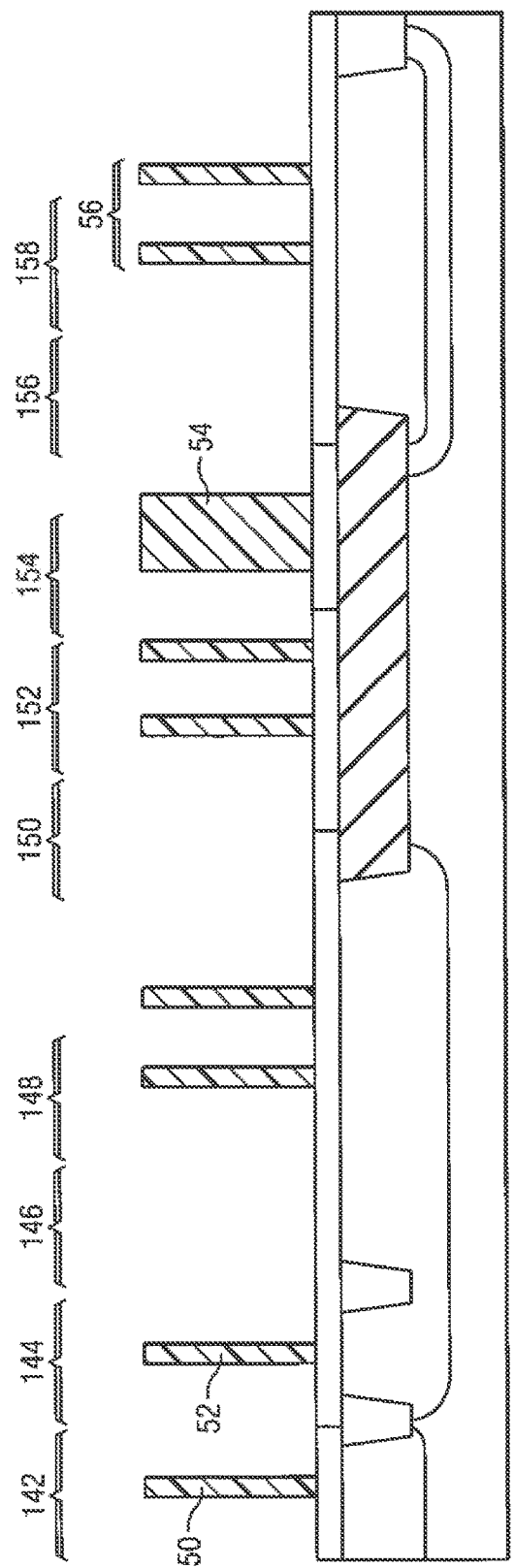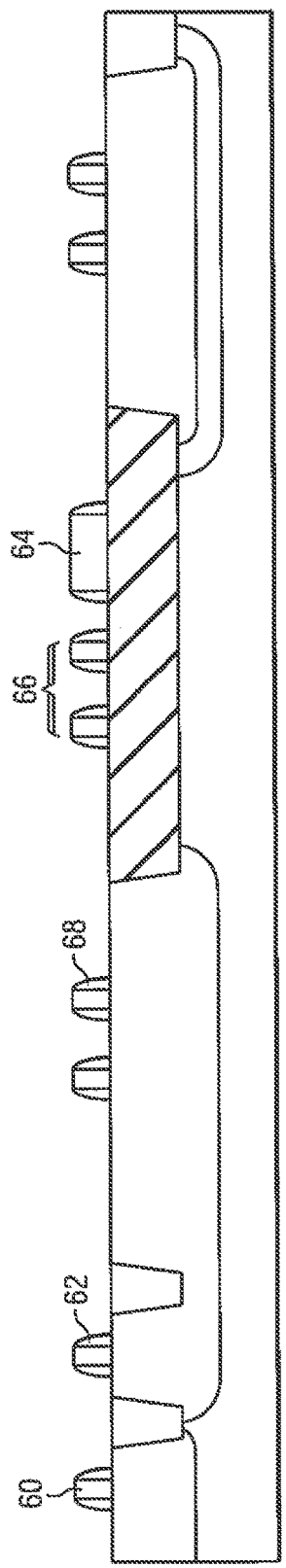

FIG. 1F-B

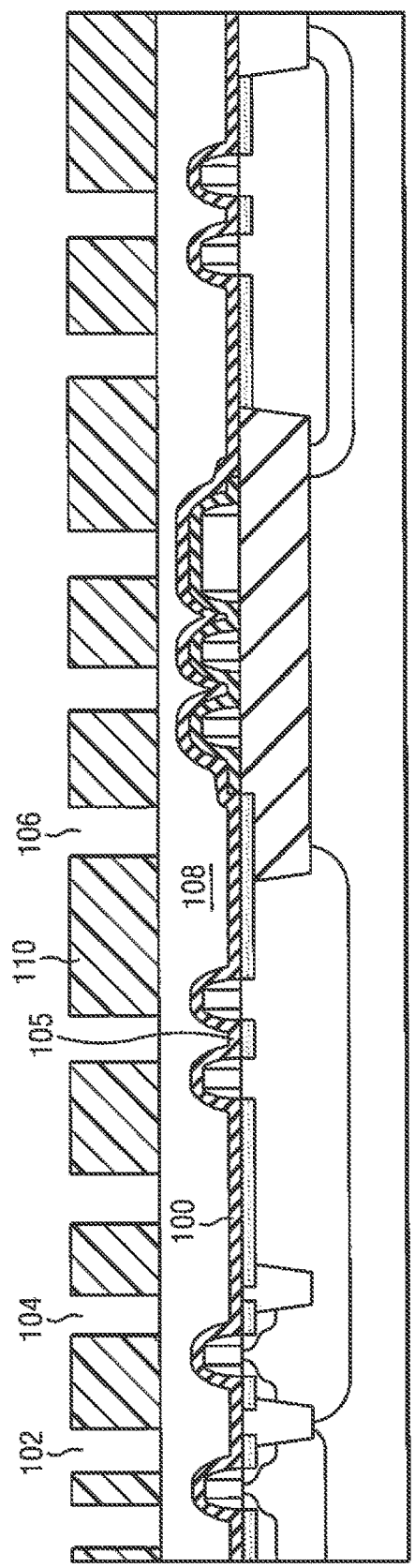
FIG. 1J-A
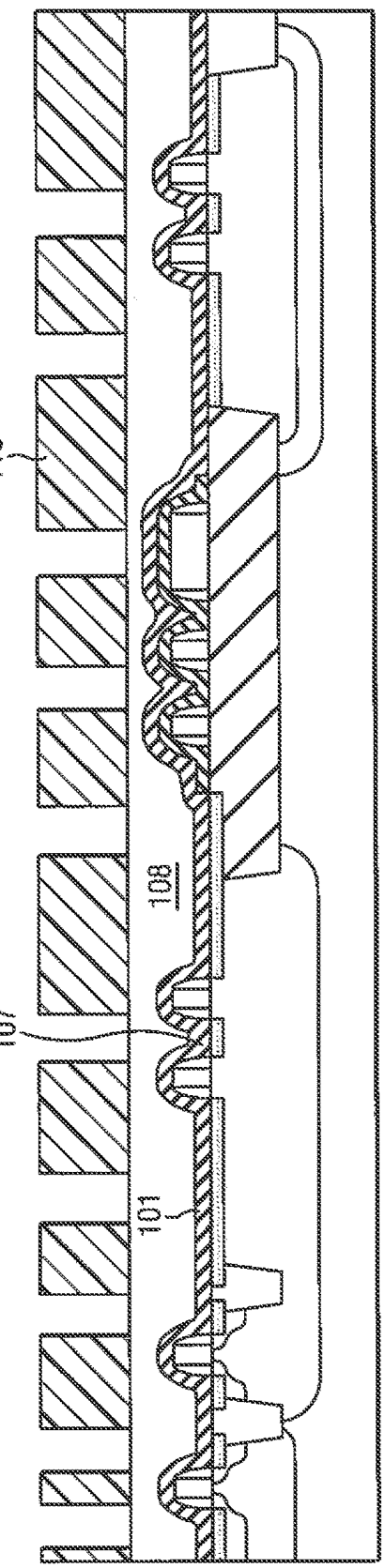
FIG. 1J-B

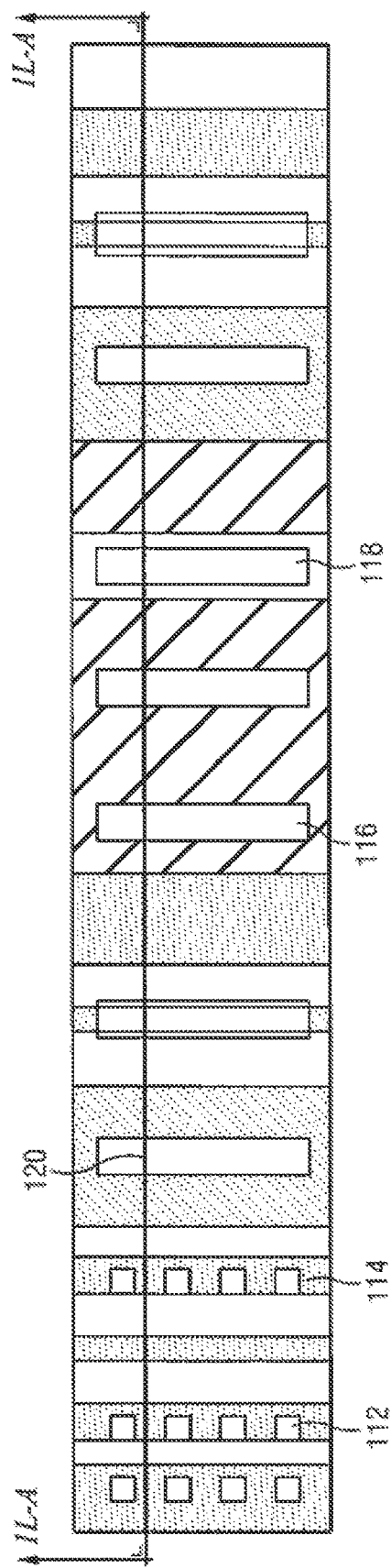
FIG. 1K
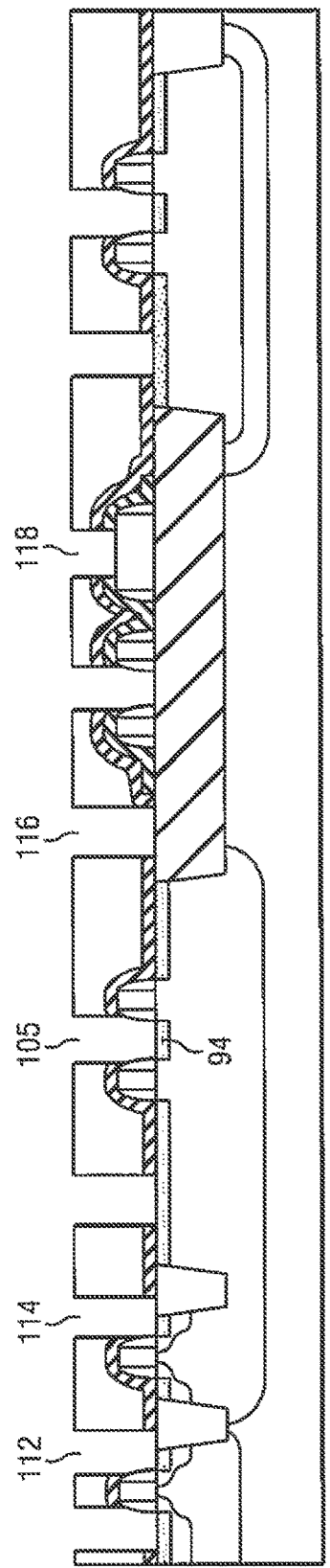
FIG. 1L-A

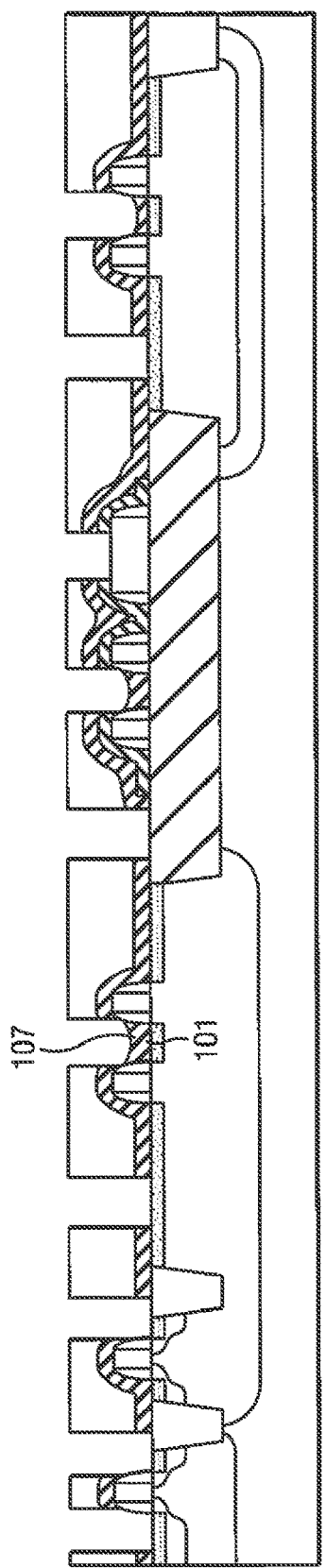
FIG. 1L-B
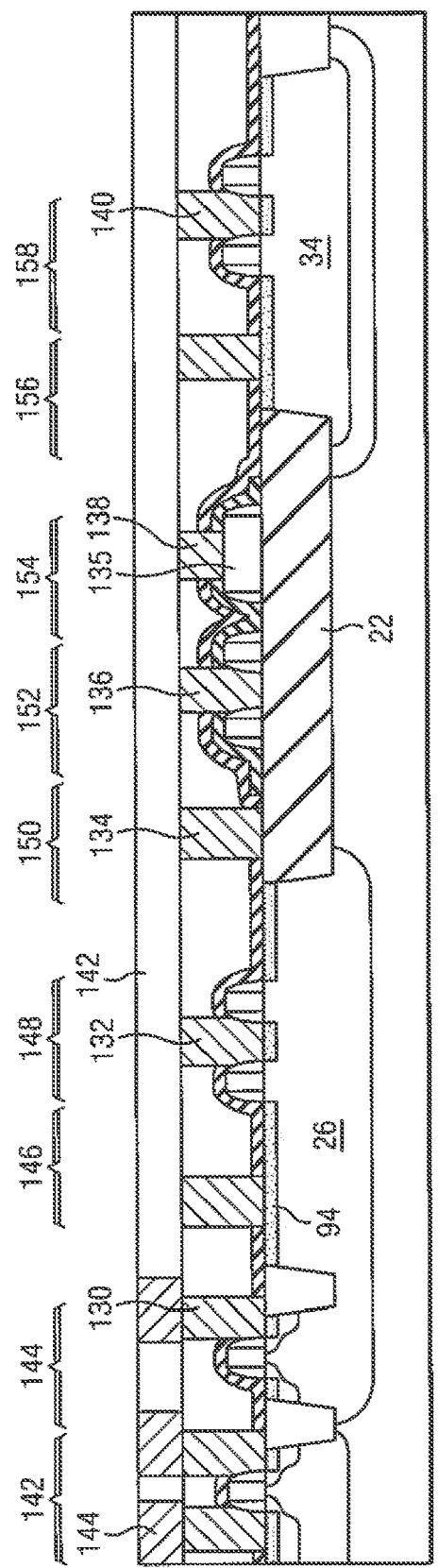
FIG. 1M-A

FIG. 1M-B

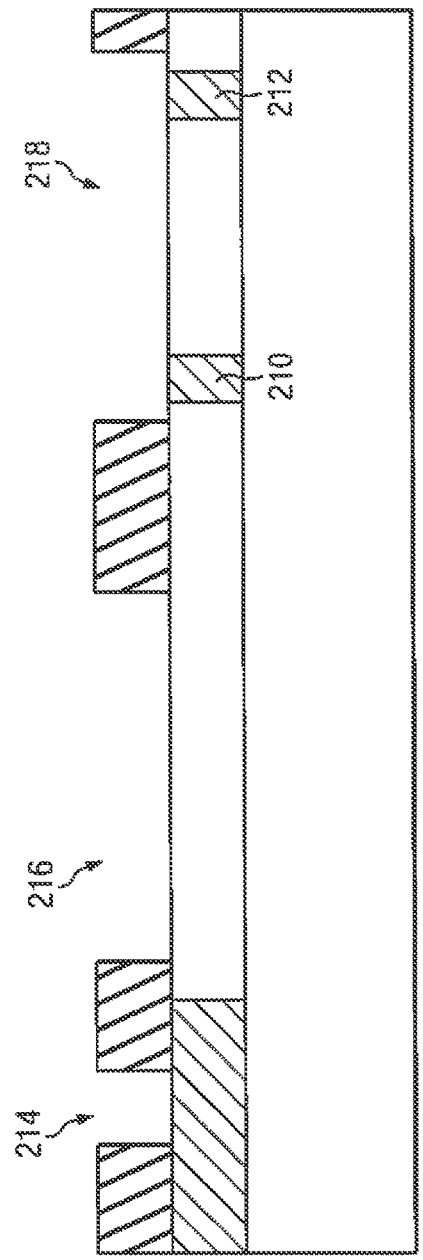
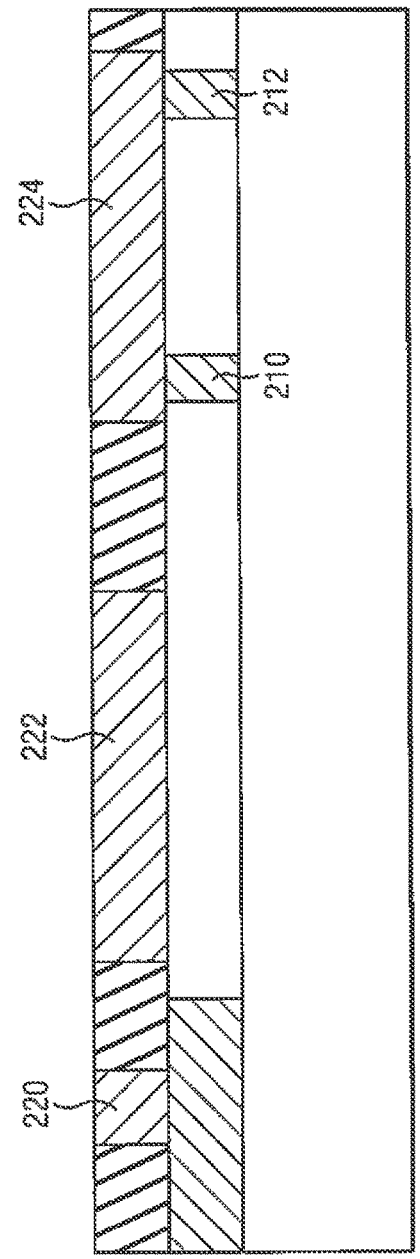
FIG. 3B
FIG. 3C

EMBEDDED TUNGSTEN RESISTOR

CROSS-REFERENCE TO RELATED APPLICATIONS

Under 35 U.S.C. §§ 120, this continuation application claims priority to and benefits of U.S. patent application Ser. No. 13/586,672 (TI-69351), filed on Aug. 15, 2012, which also claims priority to U.S. Provisional Application No. 61/523,575, filed Aug. 15, 2011. The entirety of the above reference applications is herein incorporated by reference.

FIELD OF THE INVENTION

This invention relates to the field of integrated circuits. More particularly, this invention relates to forming resistors with a high temperature coefficient of resistance in integrated circuits.

BACKGROUND

In addition to transistors, other devices such as resistors, capacitors and diodes are formed during the manufacture of integrated circuits. These devices may be used to set voltage levels, pass or block signals, and form delay paths. In some cases these devices may be used to measure temperature.

The equation for the resistance of resistor material as a function of temperature is given by the equation $$R_{TEMP} = R_0 + C_1 \Delta T + C_2 (\Delta T)^2$$

Where $R_0$ is the resistance at a reference temperature such as room temperature, $C_1$ is the linear temperature coefficient of resistance, $C_2$ is the quadratic temperature coefficient of resistance, and $\Delta T$ is the difference between ambient temperature and the reference temperature.

Because the resistance of metals commonly used in integrated circuits such as copper and aluminum has low resistance, when a temperature sensing resistor is needed, a high resistance metal such as nickel or molybdenum is added to the integrated circuit process flow to form the temperature sensing resistor. Addition of a new metal to the manufacturing flow adds cost by requiring additional deposition and etching manufacturing steps.

BRIEF DESCRIPTION OF THE DRAWINGS

FIGS. 1A-1E, 1F-A, 1F-B, 1G-1I, 1J-A, 1J-B, 1K, 1L-A, 1L-B, 1M-A and 1M-B are illustrations of steps in the fabrication of integrated circuits formed according to principles of the invention.

FIGS. 3A-3D are illustrations of steps in the fabrication of integrated circuits formed according to principles of the invention.

DETAILED DESCRIPTION OF EXAMPLE EMBODIMENTS

When a device, such as a resistor, is embedded in an integrated circuit and used to measure temperature, it is desirable to have a large linear change in resistance with temperature, $C_1$, with a low standard deviation and low lot-to-lot variation. It is also desirable for the material to have high resistivity so that less resistor area is needed to develop the required voltage drop.

The equation for resistance of resistor material as a function of temperature is given by the equation $$R_{TEMP} = R_0 + C_1 \Delta T + C_2 (\Delta T)^2$$

Where $R_0 = \rho * t / A$ is the resistance at a reference temperature such as room temperature, $C_1$ is the linear temperature coefficient of resistance, $C_2$ is the quadratic temperature coefficient of resistance, and $\Delta T$ is the difference between ambient temperature and the reference temperature. $\rho$ is the resistivity of the material in $\mu\Omega$-cm, t is the thickness of the resistor and A is the cross sectional area of the resistor.

As shown in TABLE 1, metals such as aluminum and copper have a large $C_1$ but low $\rho$.

TABLE 1

| MATERIAL | Element/Alloy | $C_1$ ppm | $\rho$ $\mu\Omega$-cm |
|---|---|---|---|
| Aluminum | Element | 4,308 | 2.7 |
| Constantan | Alloy | 74 | 49 |
| Copper | Element | 4041 | 1.7 |
| Gold | Element | 3715 | 2.4 |
| Iron | Element | 5671 | 9.7 |
| Manganin | Alloy | 15 | 48 |
| Molybdenum | Element | 4579 | 5.6 |
| Nickel | Element | 5866 | 7 |
| Nichrome | Alloy | 17 | 108 |
| Platinum | Element | 3729 | 10.5 |
| Silver | Element | 3819 | 1.6 |
| Steel | Alloy | 3000 | 59 |
| Tungsten | Element | 4403 | 5.6 |
| Zinc | Element | 3847 | 5.9 |

A high TCR resistor specification for deviation from nominal resistance may be +/−100 ppm/° C. for the linear temperature coefficient of resistance and +/−10 ppm/C for the quadratic temperature coefficient of resistance. This high TCR resistor tolerance may enable a temperature sensor accuracy of +/−0.01%/Δ° C.

Figure 1A:
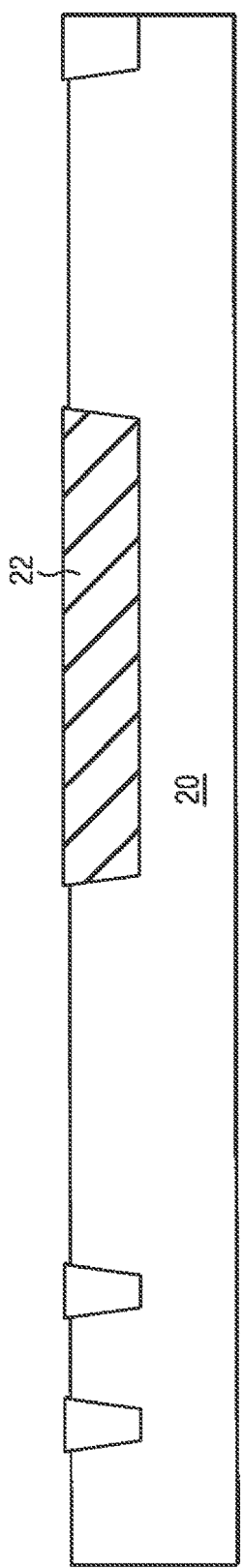
Figure 1B:
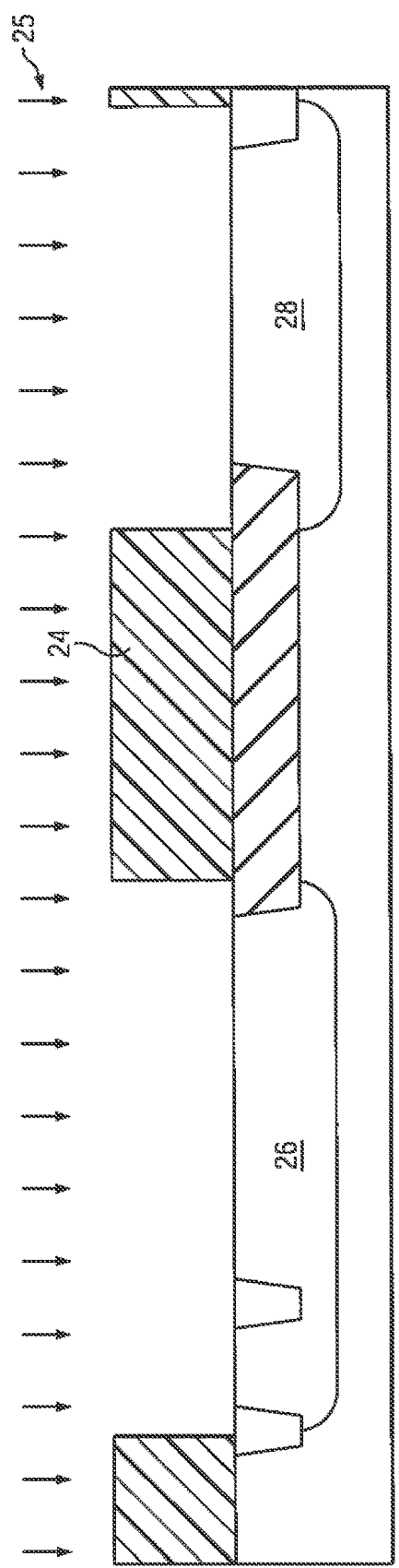
Figure 2A:
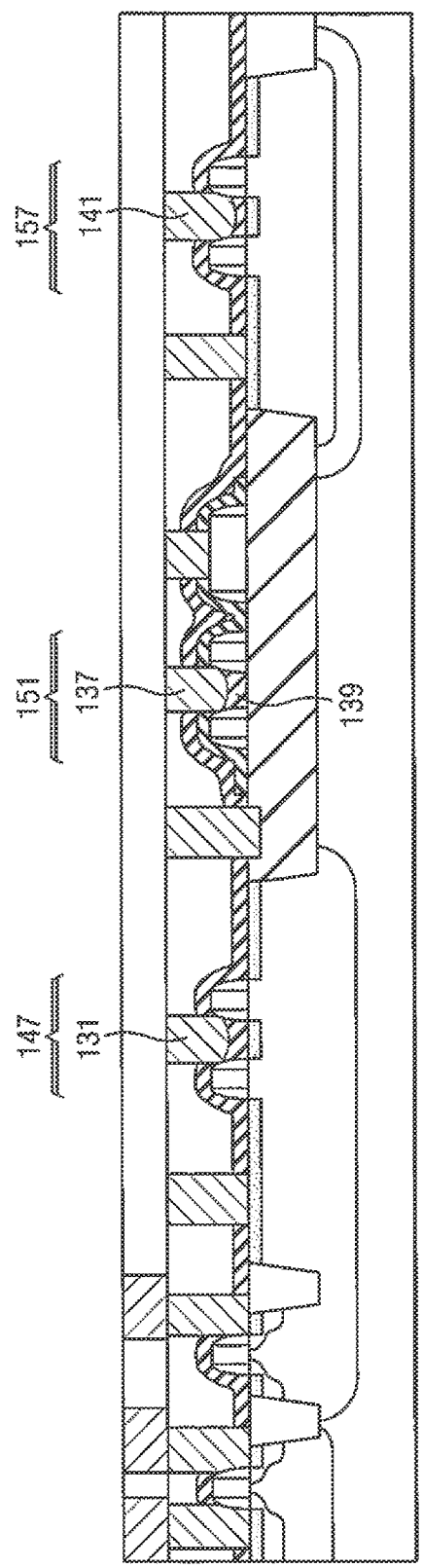
FIGS. 2A and 2B are cross sections of example embodiments of the invention.
Figure 2A:
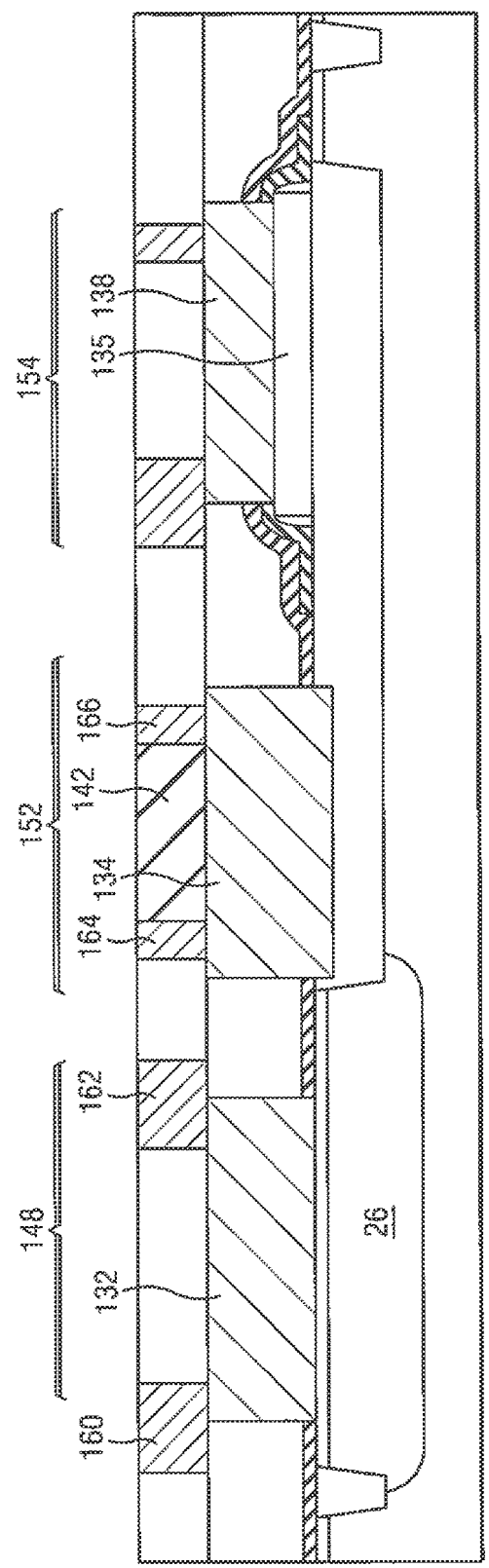
Figure 2B:
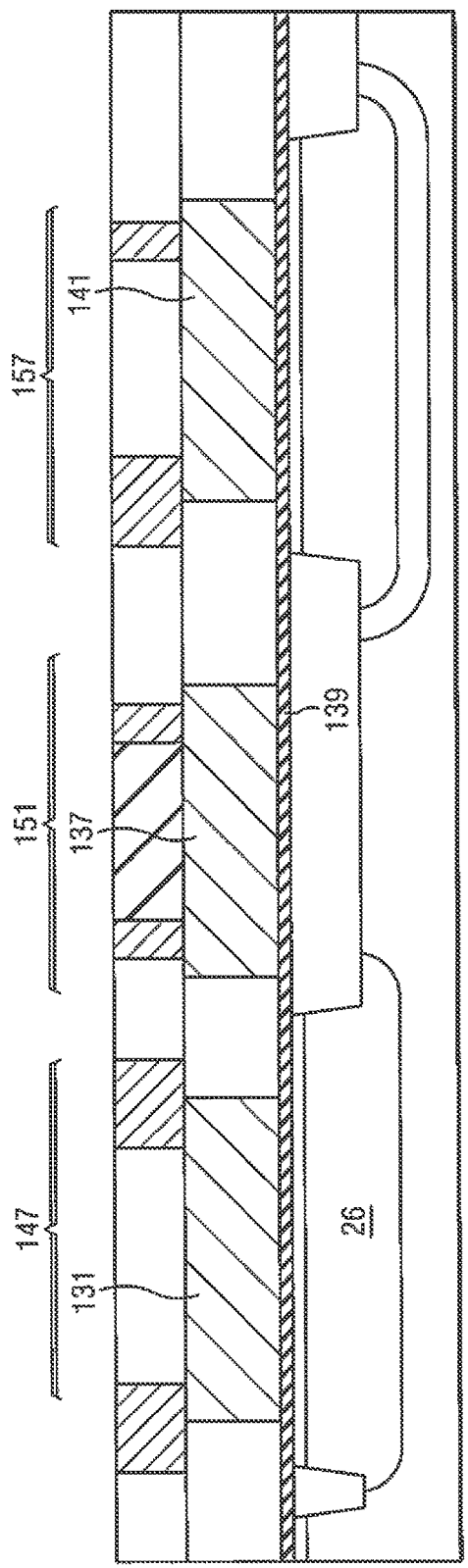

Resistors that meet the requirements for an embedded resistor temperature sensor are illustrated in FIGS. 1M-A, 1M-B, 2A, 2B and 3D. In FIGS. 2A and 2B, the resistors 147, 148, 151, 152, 157 and 158 are formed using tungsten, a material commonly used in integrated circuits for contact plugs. These resistors may be formed at the same time as the contact plugs are formed and therefore add no additional processing steps and no additional processing cost.

Figure 3A:
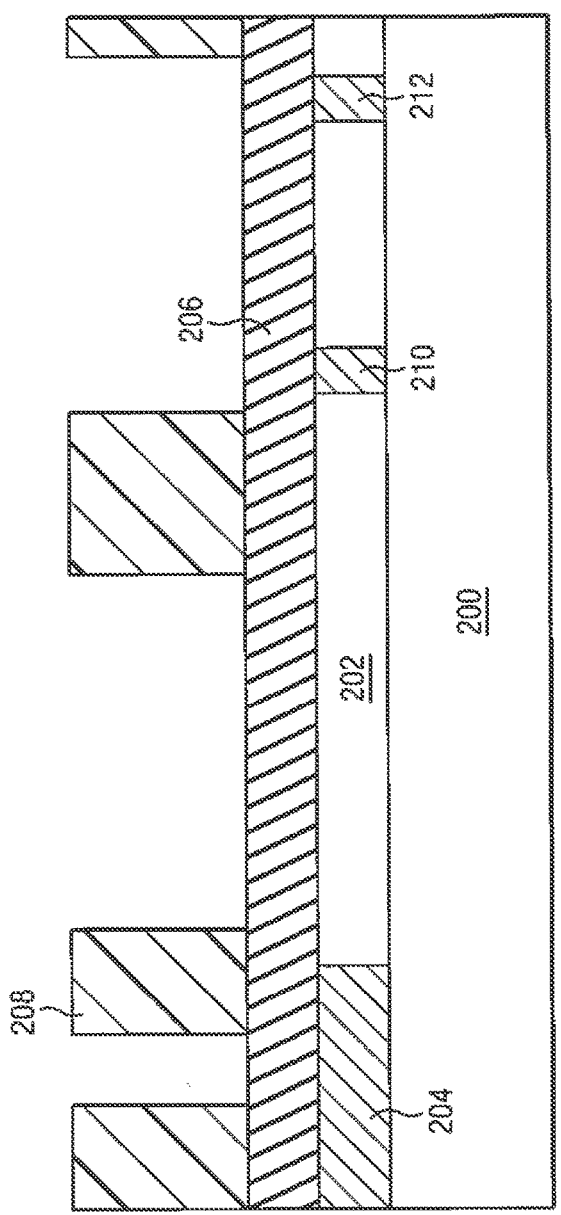
Figure 3D:
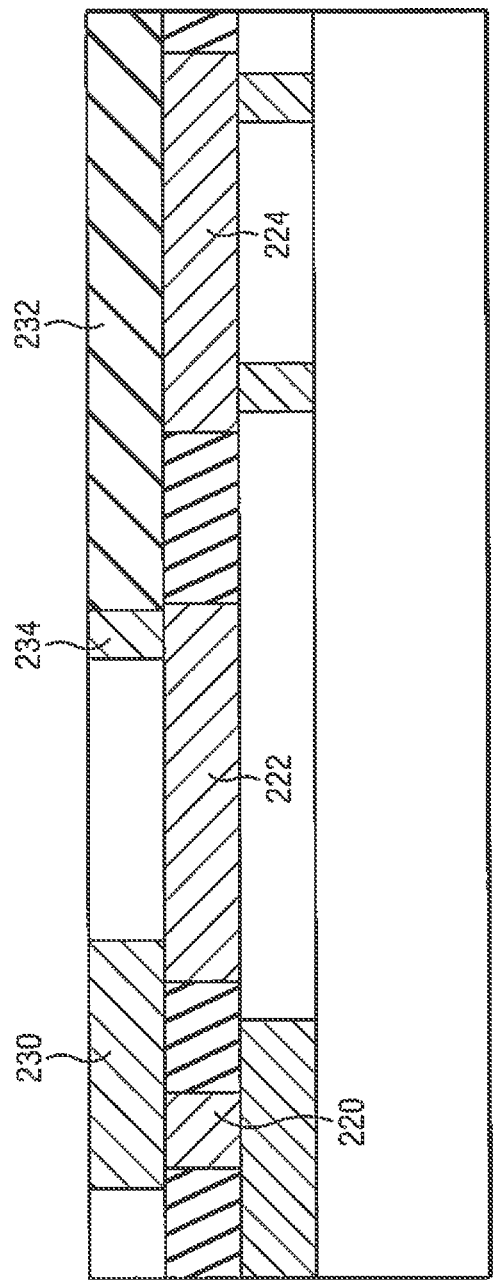

In FIG. 3D, the resistors 222 and 224 are formed using tungsten, a material commonly used for via plugs in the manufacture of integrated circuits with non damascene or single damascene interconnect. The resistors 222 and 224 are formed at the same time as via plug 220 is formed and therefore add no additional processing steps and no additional processing cost.

Tungsten resistors with a variety of resistor structures may be formed simultaneously with the formation of tungsten contact plugs. Formation of examples of these tungsten resistor structures is illustrated in FIGS. 1A through 1M-B.

In FIG. 1M-A and FIG. 2A, resistor structure 152 is formed from tungsten 136 deposited in a resistor trench over isolation dielectric 22.

In FIG. 1M-B and FIG. 2B, resistor structure 151 is formed from tungsten 138 deposited in a resistor trench between two polysilicon leads over etch stop dielectric 139. The depth of this trench is shallower than the trench for resistor 152 and therefore resistor 151 has a higher resistance per unit length and may occupy less area than resistor 152.

In resistor structure 154, (FIG. 1M-A and FIG. 2A) tungsten 138 is deposited in a resistor trench on top of an unsilicided polysilicon platform 135. The tungsten in this resistor is thinner and therefore has higher resistance per unit length than resistors 151 or 152.

Resistor structure 152 is formed in a resistor trench between two polysilicon leads over isolation dielectric 22. Sidewall dielectric prevents the tungsten 136 from shorting to the polysilicon leads. The width and therefore the resistance of resistor 152 are largely independent of the exposure of the contact photo pattern and also upon the amount of contact over etch. The depth of resistor 152 depends upon how far down into the isolation dielectric the resistor trench is etched during contact over etch.

In FIG. 1M-B and FIG. 2B, resistor structure 151 is formed in a resistor trench between two polysilicon leads over isolation dielectric 22. Sidewall dielectric prevents the tungsten 137 from shorting to the polysilicon leads. The width and therefore the resistance of resistor 151 is largely independent of the contact photo pattern exposure and also largely independent of contact over etch. The depth of resistor 151 trench is largely independent of contact over etch because of the remaining contact etch stop liner 139 at the bottom of the resistor 151 trench.

In FIG. 1M-A, resistor structure 146 is formed in a trench over nwell 26. Implants such as source and drain extension implants and source and drain implants are blocked from regions of the nwell 26 where resistor structure 146 is to be formed. Silicide 94 forms a Schottky diode to the nwell 26. When the nwell 26 is grounded, the Schottky diode is reverse biased and has a high resistance which prevents the nwell from shorting the resistor 146. Because of the high selectivity of the contact etch to silicide, forming the resistor 146 over a silicided active area 94 enables the resistor height to be substantially independent of contact over etch. This may reduce resistor variability across the wafer and lot-to-lot.

Resistor structure 148 is formed over active area to minimize resistor height variation due to contact over etch and is formed between polysilicon leads to minimize variation in width of the resistor due to contact pattern exposure and contact over etch.

Resistor structures 156 and 158 are similar to resistor structures 146 and 148 except that they are formed over an isolated p-well 34 instead of over an nwell. A resistor may be formed on a Schottky diode on n-type or on p-type semiconductor material as long as the Schottky diode may be reverse biased into high resistance preventing underlying semiconductor material from shorting the resistor.

A process for forming resistors in an integrated circuit simultaneously with forming tungsten contact plugs is described in FIGS. 1A through 1M-B. A variety of high TCR resistors are formed in the integrated circuit without adding processing steps or processing cost. It is understood that in a particular integrated circuit not all of the resistors may be formed. In a particular integrated circuit only one type of tungsten resistor may be formed or several may be formed, as desired.

FIG. 1A shows a portion of an integrated circuit that is processed through shallow trench isolation (STI). STI geometries 22 are formed in a p-type semiconductor substrate 20.

Referring now to FIG. 1B an nwell photo resist pattern 24 is formed on the integrated circuit wafer with openings through which n-type dopant 25 is implanted to form nwells 26 and 28.

Figure 1C:
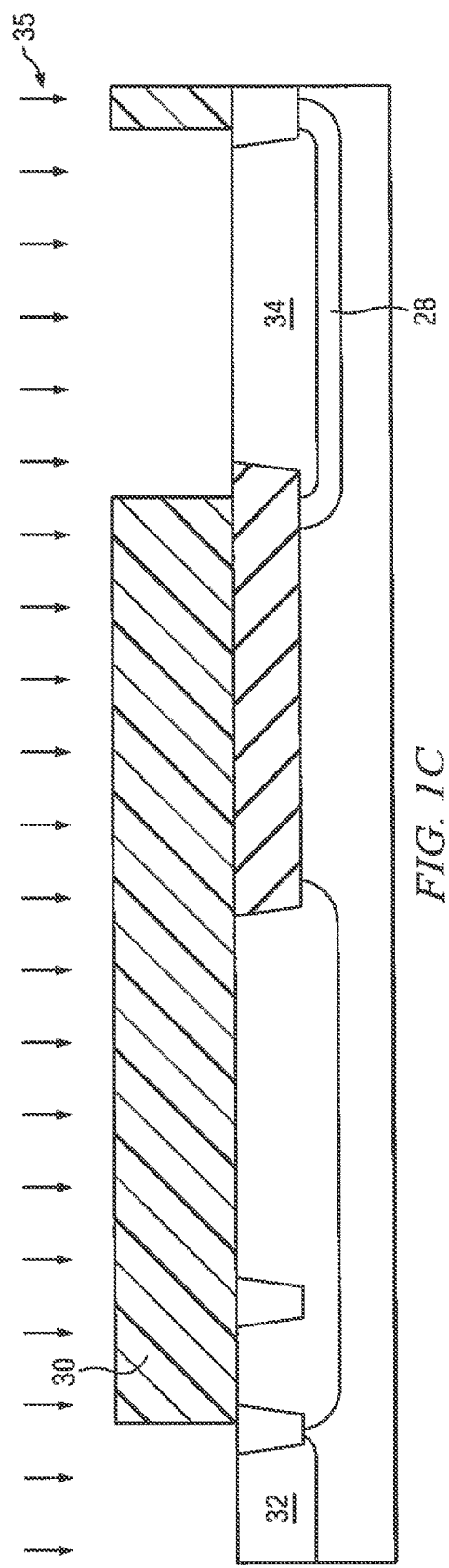

In FIG. 1C, nwell photo resist pattern 24 is removed and pwell photo resist pattern 30 is formed on the surface of the integrated circuit wafer with openings through which p-type dopant 35 is implanted to form pwell 32 in the p-type substrate 20 and to form isolated pwell 34 in nwell 28. In some integrated circuit process flows, a separate pwell pattern and implantation step may not be performed. Isolated pwells may not be formed in some integrated circuit manufacturing flows.

Figure 1D:
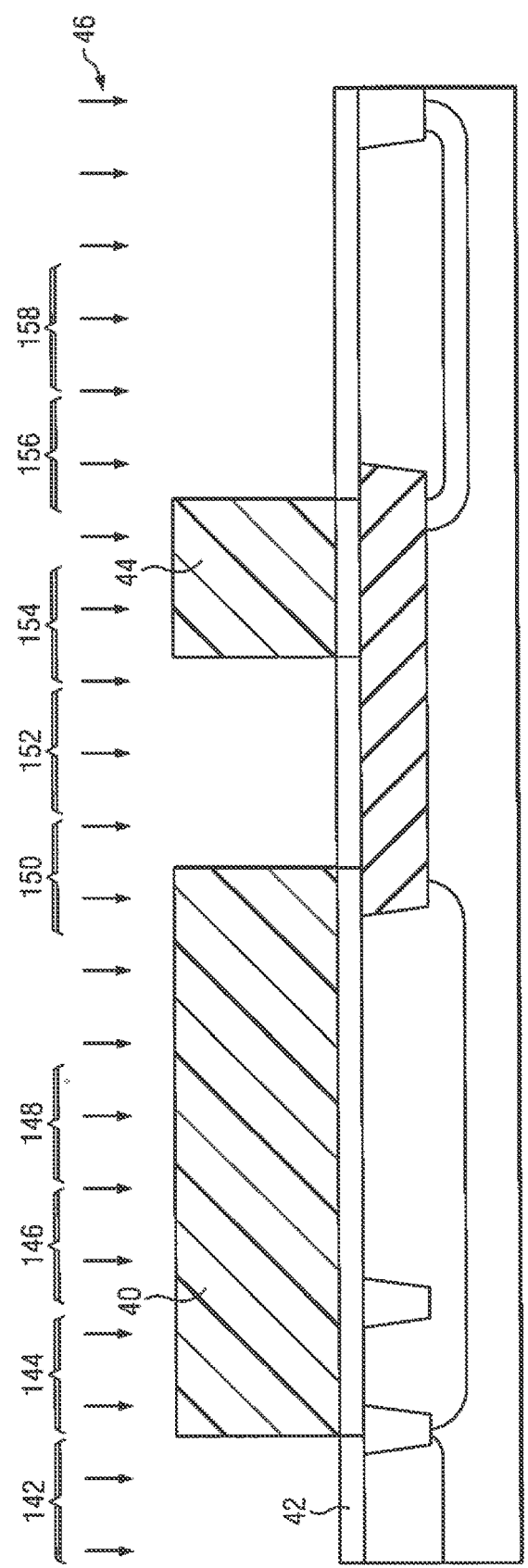

Pwell photoresist pattern 30 is removed and a transistor gate dielectric and a layer of polysilicon 42 are deposited on the integrated circuit wafer as shown in FIG. 1D. Gate doping photo resist pattern 40 is formed on the polysilicon layer 42 with openings through which an n-type dopant 46 such as phosphorus or arsenic is implanted to set the work function in the NMOS transistor regions 142. The dopant 46 is blocked from PMOS transistor areas 144 and from regions 44 where a resistor 154 is to be formed on polysilicon platform 64.

Referring now to FIG. 1E, photoresist pattern 40 is removed and a transistor gate photo resist pattern is formed on the polysilicon layer 42 with geometries 50 and 52 to defined gates in NMOS transistor area 142 and PMOS transistor area 144. Geometry 54 defines a polysilicon platform on which a resistor 154 is to be formed, and geometry 56 defines polysilicon lead pairs which may be used to define the width of resistors 148, 152, and 158 as is described below.

FIG. 1F-A shows the integrated circuit after the polysilicon 42 is etched forming NMOS gate 60, PMOS gate 62, polysilicon platform 64 on which a resistor is to be formed, and pairs of polysilicon leads 66 which may be used to define the width of resistors. Dielectric sidewalls 68 are formed on the polysilicon leads by depositing a dielectric such as silicon nitride and performing an anisotropic etch. The dielectric sidewalls on the polysilicon lead pairs 66 prevent the tungsten resistor whose width is determined by the spacing between the two polysilicon leads from shorting to the polysilicon leads.

FIG. 1F-B shows an alternate embodiment, which is identical to the embodiment of FIG. 1F-A with the exception that pairs of polysilicon leads 65 are formed in place pairs of polysilicon leads 66 of FIG. 1F-A. Pairs of polysilicon leads 65 are formed closer together than pairs of polysilicon leads 66. As described below, a contact etch stop liner deposited between the closely spaced leads 65 may form thicker contact etch stop liner in this region that is not completely removed during contact etch. The contact etch stop liner remaining between leads 65 after contact etch limits the depth of the resistor trench and forms the bottom surface of the resistor trench. Stopping the resistor trench on etch stop dielectric rather than STI dielectric improves trench depth control and also forms a resistor with reduced height and increased resistance.

Figure 1G:
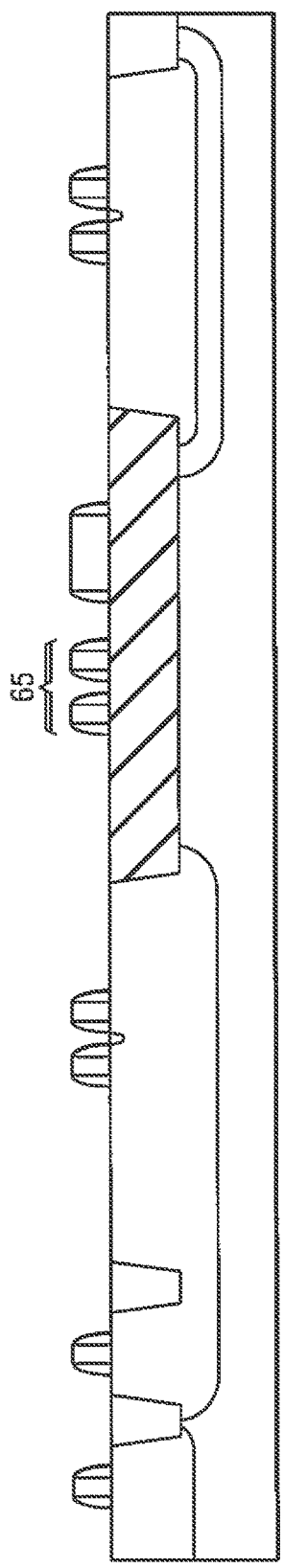
Figure 1G:
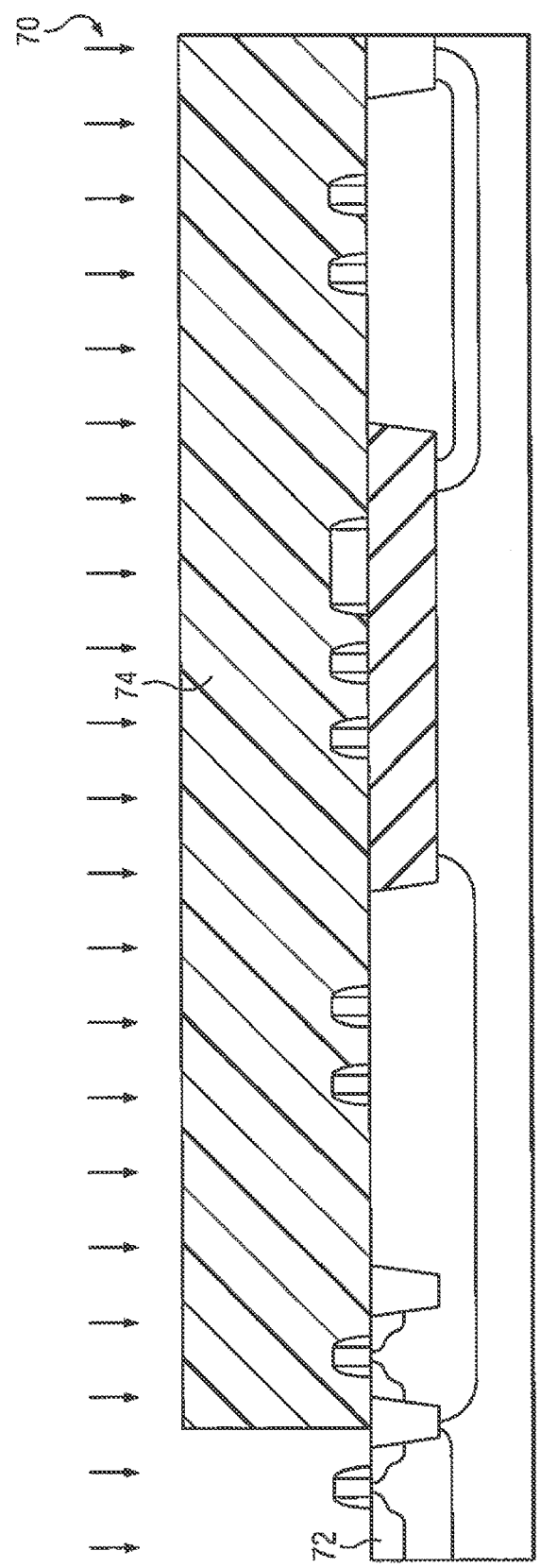

In FIG. 1G, an NSD photo resist pattern 74 is formed on the integrated circuit and n-type dopants 70 such as phosphorus and arsenic are implanted to form source and drain diffusions 72 on the NMOS transistor. The implant is blocked from PMOS transistor areas and from areas where resistors are to be formed.

Figure 1H:
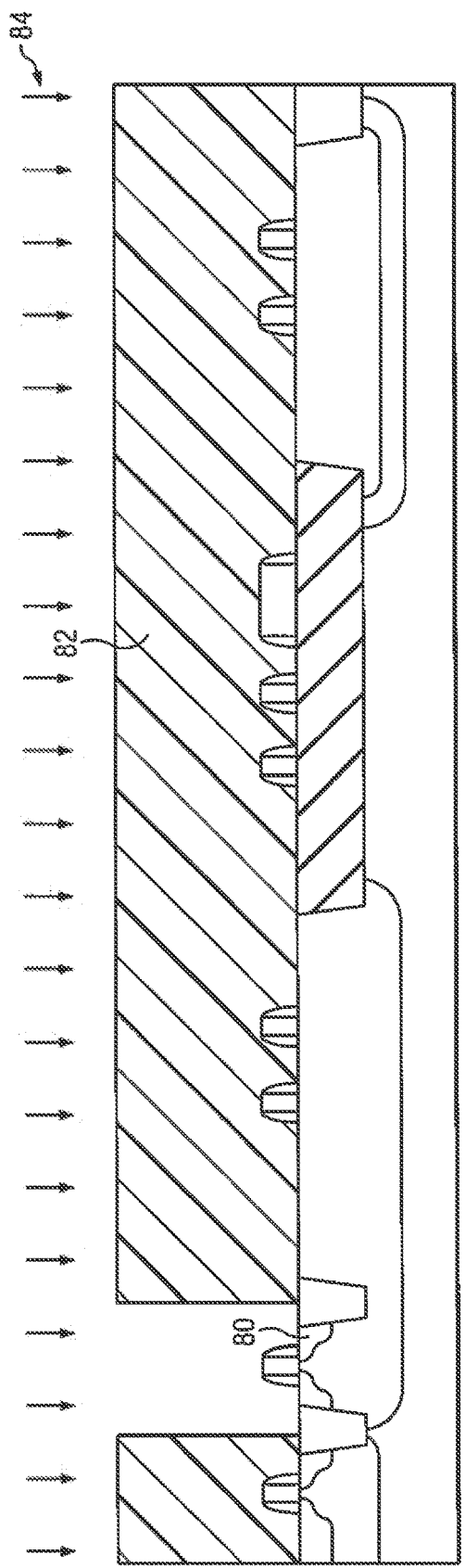

In FIG. 1H, photoresist pattern 74 is removed and a PSD photo resist pattern 82 is formed on the integrated circuit and p-type dopants 84 such as boron and $BF_2$ are implanted to form source and drain diffusions 80 on the PMOS transistor. The implant is blocked from NMOS transistor areas and from areas where resistors are to be formed.

Figure 1I:
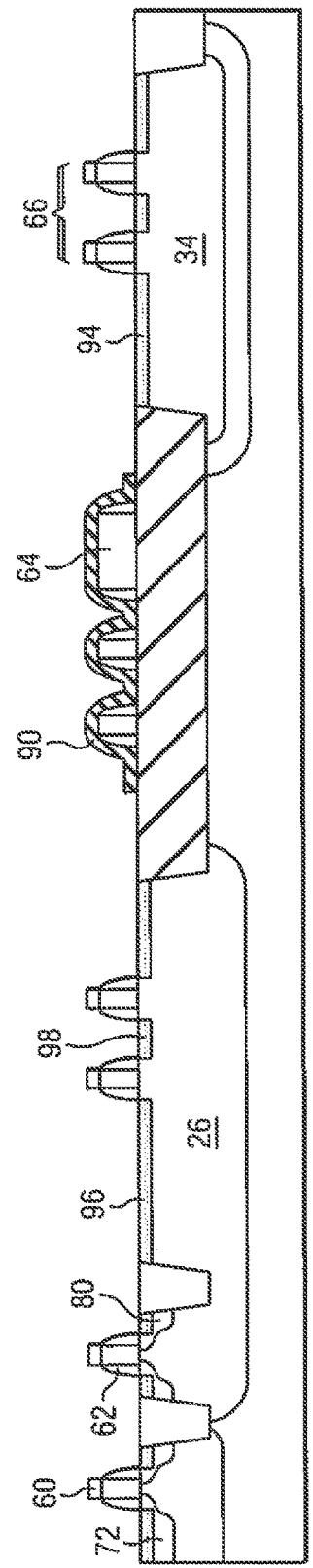

Referring now to FIG. 1I, photoresist pattern 82 is removed and a silicide block dielectric layer 90 is deposited, patterned with a silicide block photo resist pattern, and etched. Silicide block dielectric 90 is left in regions of the wafer where it is desired to block silicide formation. One such silicide blocked region is the polysilicon platform 64 on which a resistor is to be formed.

Silicide layer 96 is then formed on the gates 60 and 62, source and drains 72 and 80, of the NMOS 142 and PMOS 144 transistors, on the polysilicon pairs 66 not covered silicide block dielectric layer 90, and on the lightly doped nwell 26 and isolated pwell 34 regions forming Schottky diodes where resistors 146, 148, 156, and 158 are to be formed. Because source and drain extension dopants and source and drain dopants are blocked from the wells, 26 and 34 where the resistors are to be formed, these regions remain lightly doped. Silicide forms a Schottky junction to these lightly doped regions. The Schottky diode may be reverse biased into a very high resistance state. Resistors 146, 148, 156, and 158 may be formed on reverse biased Schottky diodes without shorting to the underlying wells 26 and 34. Because the selectivity of contact etch to silicide is very high, the height of resistors formed on silicided active regions in wells 26 and 34 is well controlled.

Contact etch stop layers 100 and 101 and premetal dielectric (PMD) layer 108 are formed on the integrated circuit as shown in FIGS. 1J-A and 1J-B. Contact photo resist pattern 110 is formed on the PMD layer 108 with openings 102 to form contacts to the NMOS transistor, openings 104 to form contacts to the PMOS transistor, and openings 106 to form resistors.

The polysilicon leads in the polysilicon lead pairs are spaced closer together in FIG. 1J-B than in FIG. 1J-A so that the contact etch stop layer 101 forms a layer of contact etch stop liner 107 that is thicker than etch stop liner 105 in FIG. 1J-A. This thicker contact etch stop liner 107 is be completely removed during contact etch. The remaining contact etch stop layer in this region forms the bottom of the resistor trench. The spacing of the two polysilicon leads and the thickness of the contact etch stop liner may be optimized to leave the desired amount of contact etch stop liner remaining at the bottom of the resistor trench post contact etch.

As shown in the top down view of the integrated circuit of in FIG. 1K, square contact openings 112 are formed to the NMOS transistors, square contact openings 114 are formed to PMOS transistors, and rectangular trenches such as 116 and 118 are formed where resistors are to be formed. The length of the resistor trench depends upon the resistance desired. The resistor trench may have both horizontal and vertical segments to fit the required resistor length within a specific area.

The cross-section shown in FIG. 1L-A is taken along line 120 in FIG. 1K. FIG. 1L-B shows a cross-section that is identical to that in FIG. 1L-A with the exception that the resistor trench between the closer spaced polysilicon leads stops on remaining contact etch stop liner 101 whereas the resistor trench 105 shown in FIG. 1L-A between the wider spaced polysilicon leads stops on silicide layer 94.

FIG. 1M-A shows the integrated circuit after the contact holes 112 and 114 and the resistor trenches are filled with CVD tungsten. Filling the resistor trenches with CVD tungsten forms tungsten resistors 146, 148, 150, 152, 154, 156, and 158. In an example embodiment, after the contact holes and resistor trenches have been etched a thin barrier layer of TiN is deposited prior to filling the contacts and resistor trenches with CVD-W. CMP is then used to planarize the contact plugs and the resistors.

Intermetal dielectric layer 142 and first layer interconnect 144 are then formed on the integrated circuit. The interconnect 144 may be a metal such as aluminum alloy which is deposited and etched or may be a metal such as copper which is formed in dielectric trenches etched using a damascene process.

FIG. 1M-B is identical to FIG. 1M-A with the exception that resistors 147, 151, and 157 are formed on contact etch stop liner which remains between the closely space polysilicon leads after contact and resistor trench etch. The control of the height of resistor 151 in FIG. 1M-B is better than control of the height of resistor 152 in FIG. 1M-A. The height of resistor 152 in FIG. 1M-A is dependent upon how deeply the resistor trench etches into STI dielectric during contact over etch whereas the height of resistor 151 in FIG. 1M-B is independent of contact over etch because it stops on remaining contact etch stop liner.

FIG. 2A illustrates how resistors 148, 152 and 158 of FIG. 1M-A may look when cross sectioned through the resistors lengthwise. Resistor 148 is formed on the silicided region of nwell 26. Contact etch has a high selectivity to active so the height of the resistor may be very well controlled across wafer and lot-to-lot. Interconnect geometries 160 and 162 form electrical contact to the heads of the resistor 148.

Resistor 152 is formed over isolation dielectric 22. Because of low selectivity of STI dielectric to contact etch, the height of resistor 152 depends upon how deep the resistor 152 trench penetrates into the STI dielectric 22 during contact over etch. The height and therefore resistance of the resistor 152 depends upon contact etch. First layer of interconnect geometries 164 and 166 form electrical contact to the heads of resistor 152. The interconnect geometries may overlap the resistor heads as on resistor 148 or may under lap the resistor heads as on resistor 152.

Resistor 154 is formed on a polysilicon platform 135. Silicide is blocked from forming on polysilicon platform 135. The polysilicon is high resistance. The depth of the resistor 154 trench is well controlled since the selectivity of polysilicon to the contact etch is very high. Because the height of the resistor 154 formed on the polysilicon platform 135 is significantly less than the height of the resistor 148 formed over nwell 26 and significantly less than the height of resistor 152 formed over STI dielectric 22, the resistance per unit length of resistor 158 is significantly higher than that of resistors 148 and 152. Because the resistance of resistor 158 is higher than that of resistors 148 and 152, a resistor 158 with equivalent resistance to resistors 148 and 152 may be formed in smaller area.

FIG. 2B illustrates resistors 147, 151 and 157 of FIG. 1M-B when cross sectioned lengthwise. Because these resistors are formed over closely spaced polysilicon leads where a thicker layer of contact etch stop liner may form, the bottom of these resistors is formed on contact etch stop liner that remains after the contact and resistor trench etch. Because resistors 147 and 157 are formed on dielectric, there is no requirement for a reverse biased Shottky diode to be formed beneath the resistors 147 and 157 which are formed over active regions in nwell 26 or pwell 34. Because resistor 151 is formed over contact etch stop liner 139 rather than STI dielectric, the height of resistor 151 is independent of contact over etch.

Resistors formed simultaneously with the formation of tungsten via plugs are illustrated in FIGS. 3A through 3D. Resistor structures 222 and 224 (FIG. 3D) are formed in trenches in the ILD dielectric 206 which are etched simultaneously with via 220 (FIG. 3D).

As shown in FIG. 3A, an intermetal dielectric layer (IMD) 202 with interconnect geometries 204, 210, and 212 is formed on an integrated circuit 200. Interconnect geometries 204, 210, and 212 may be formed with a first layer of interconnect or may be formed with a higher level of interconnect. Integrated circuit 200 may have one or more levels of interconnect.

ILD layer 206 is formed on the integrated circuit over IMD layer 202 and over interconnect geometries 204, 210, and 212. A via photo resist pattern 208 is formed on the integrated circuit with openings to etch via 214 (FIG. 3B) and with openings to etch trenches, 216 and 218 (FIG. 3B) in which resistors are to be formed.

As shown in FIG. 3B, resistor trench 218 is formed over interconnect leads 210 and 212 which are spaced apart to form electrical contact to the heads of the resistor 224.

FIG. 3C shows the integrated circuit after the via opening 214 and resistor trenches 216 and 218 are filled with tungsten and planarized to form via plug 220 and resistors 222 and 224. Underlying interconnect geometries 210 and 212 form electrical contact to the bottom side of the heads of resistor 224.

FIG. 3D shows the integrated circuit after intermetal dielectric layer 232 is deposited and interconnect geometries 230 and 234 are formed. Interconnect geometries 230 and 234 form top side electrical contact to the heads of resistor 222.

One or both types of resistors 222 and 224 may be formed in a production integrated circuit. In addition a resistor with one resistor head contacted from above and the other resistor head contacted from below may be formed. The high TCR resistors described above are formed simultaneously with via plugs and without adding additional process steps or additional cost to the integrated circuit manufacturing flow.

Those skilled in the art to which this invention relates will appreciate that many other embodiments and variations are possible within the scope of the claimed invention.

What is claimed is:

1. An integrated circuit, comprising:
a substrate;
a well formed in the substrate;
a silicide layer formed in the well;
a tungsten resistor formed over the silicide layer;
a first polysilicon lead formed over the silicide layer; and
a second polysilicon lead formed over the silicide layer and adjacent to the first polysilicon lead to define a resistor trench above the substrate.

2. The integrated circuit of claim 1, wherein the silicide layer includes a silicide material selected from a group consisting of titanium silicide, cobalt silicide, nickel silicide and combinations thereof.

3. The integrated circuit of claim 1, wherein the well includes an nwell.

4. The integrated circuit of claim 1, wherein the well includes an isolated pwell.

5. The integrated circuit of claim 1, further comprising:
a MOS transistor region having a doped region in the substrate and outside of the silicide layer such that the silicide layer is free of contact from the doped region of the MOS transistor region.

6. The integrated circuit of claim 1, wherein the tungsten resistor is developed from within the resistor trench and extending above the first and second polysilicon leads.

7. The integrated circuit of claim 1, further comprising:
an etch stop dielectric liner covering the first and second polysilicon leads while exposing the tungsten resistor above the first and second polysilicon leads.

8. The integrated circuit of claim 1, further comprising:
an etch stop dielectric liner formed in the resistor trench and on the silicide layer to interface between the tungsten resistor and the silicide layer.

9. An integrated circuit, comprising:
a substrate;
a first well formed in the substrate;
a second well formed in the substrate;
an isolation dielectric layer deposited onto the substrate to separate the second well from the first well; and
a tungsten resistor formed over the isolation dielectric layer;
a first polysilicon lead formed over the isolation dielectric layer; and
a second polysilicon lead formed over the isolation dielectric layer and adjacent to the first polysilicon lead to define a resistor trench above the isolation dielectric layer.

10. The integrated circuit of claim 9, wherein the first well includes an nwell, and the second well includes an isolated pwell.

11. The integrated circuit of claim 9, wherein the tungsten resistor is developed from within the resistor trench and extending above the first and second polysilicon leads.

12. The integrated circuit of claim 9, further comprising:
an etch stop dielectric liner covering the first and second polysilicon leads while exposing the tungsten resistor above the first and second polysilicon leads.

13. The integrated circuit of claim 9, further comprising:
an etch stop dielectric liner formed in the resistor trench and on the isolation dielectric layer to interface between the tungsten resistor and the isolation dielectric layer.

14. The integrated circuit of claim 9, further comprising:
an unsilicided polysilicon platform formed above the isolation dielectric layer to interface between the tungsten resistor and the isolation dielectric layer.

15. The integrated circuit of claim 14, further comprising:
an etch stop dielectric liner covering the unsilicided polysilicon platform while exposing the tungsten resistor.

16. An integrated circuit, comprising:
a substrate;
a first well formed in the substrate;
a second well formed in the substrate;
an isolation dielectric layer deposited onto the substrate to separate the second well from the first well;
a first tungsten resistor formed over the isolation dielectric layer;
a silicide layer formed in the first well; and
a second tungsten resistor formed over the silicide layer;
a first polysilicon lead formed over the silicide layer; and
a second polysilicon lead formed over the silicide layer and adjacent to the first polysilicon lead to define a resistor trench above the substrate.

17. The integrated circuit of claim 16, wherein the first well includes an nwell, and the second well includes an isolated pwell.

18. The integrated circuit of claim 16, wherein the first well includes an isolated pwell, and the second well includes an nwell.

19. The integrated circuit of claim 16, wherein the second tungsten resistor is developed from within the resistor trench and extending above the first and second polysilicon leads.

20. The integrated circuit of claim 16, further comprising:
a third polysilicon lead formed over the isolation dielectric layer;
a fourth polysilicon lead formed over the isolation dielectric layer and adjacent to the third polysilicon lead to define a resistor trench above the isolation dielectric layer;

wherein the first tungsten resistor is developed from within the resistor trench and extending above the third and fourth polysilicon leads.

21. An integrated circuit, comprising:
a substrate;
a first well formed in the substrate;
a second well formed in the substrate;
an isolation dielectric layer deposited onto the substrate to separate the second well from the first well;
a first polysilicon lead formed above the substrate;
a second polysilicon lead formed above the substrate and adjacent to the first polysilicon lead to define a resistor trench above the substrate; and
a tungsten resistor formed over the isolation dielectric layer and developed from within the resistor trench and extending above the first and second polysilicon leads.

22. An integrated circuit, comprising:
a substrate;
a first well formed in the substrate;
a second well formed in the substrate;
an isolation dielectric layer deposited onto the substrate to separate the second well from the first well;
a first tungsten resistor formed in contact with the isolation dielectric layer;
a silicide active geometry formed in the first well and establishing a diode structure with the first well;
a first polysilicon lead formed above the substrate;
a second polysilicon lead formed above the substrate and adjacent to the first polysilicon lead to define a resistor trench above the substrate; and
a second tungsten resistor formed above the silicide active geometry and developed from within the resistor trench and extending above the first and second polysilicon leads.

* * * * *